United States Patent [19]

Ozawa et al.

[11] Patent Number: 4,491,935

[45] Date of Patent: Jan. 1, 1985

[54] SCAN-OUT SYSTEM

[75] Inventors: Hidekiyo Ozawa, Kawasaki; Mikio Itoh, Yokohama; Akira Yoshida, Kawasaki, all of Japan

[73] Assignee: Fujitsu Limited, Kawasaki, Japan

[21] Appl. No.: 447,659

[22] Filed: Dec. 7, 1982

[30] Foreign Application Priority Data

Dec. 9, 1981 [JP] Japan ............................ 56-196746

[51] Int. Cl.³ .............................................. G06F 1/00
[52] U.S. Cl. .................................................... 364/900
[58] Field of Search ... 364/200 MS File, 900 MS File

[56] References Cited

U.S. PATENT DOCUMENTS

| 3,806,891 | 4/1974 | Eichelberger et al. | 364/900 |
| 4,167,780 | 9/1979 | Hayashi | 364/200 |
| 4,335,425 | 6/1982 | Goto et al. | 364/200 |

*Primary Examiner*—Raulfe B. Zache
*Attorney, Agent, or Firm*—Staas & Halsey

[57] ABSTRACT

A shift register which is formed by a memory, the number of shift stages of the shift register is determined by the count value of a counter and designating a read address of the memory by a value obtained by subtracting an arbitrary constant from the count value of the counter through an operator. A multiplexer is provided at the input side of the operator. Output data, obtained by selecting a constant for determining the number of shift stages of the counter and a scan address in accordance with a scan enable signal, are provided to the operator. When the constant for determining the number of shift stages of the counter is input, the operation of the shift register is carried out and when the scan address is input, the content of each stage of the shift register is scanned out.

6 Claims, 5 Drawing Figures

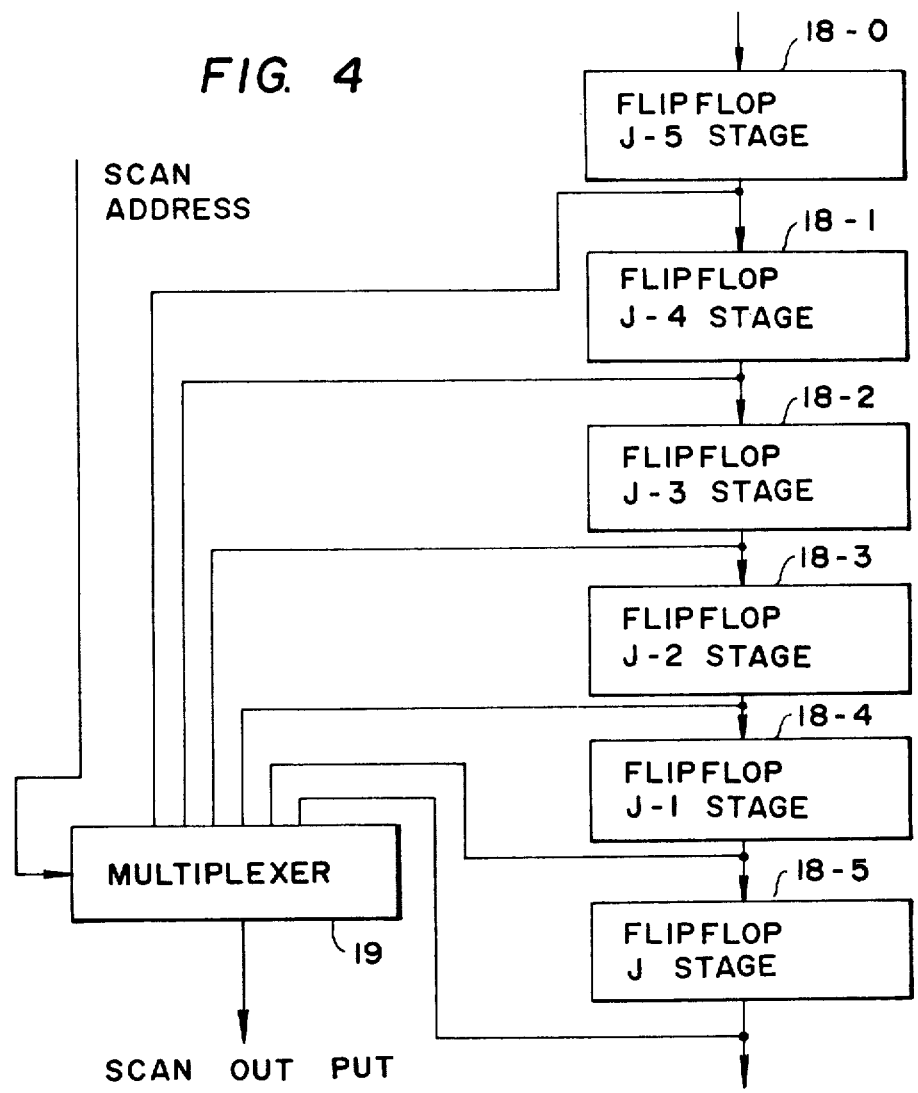

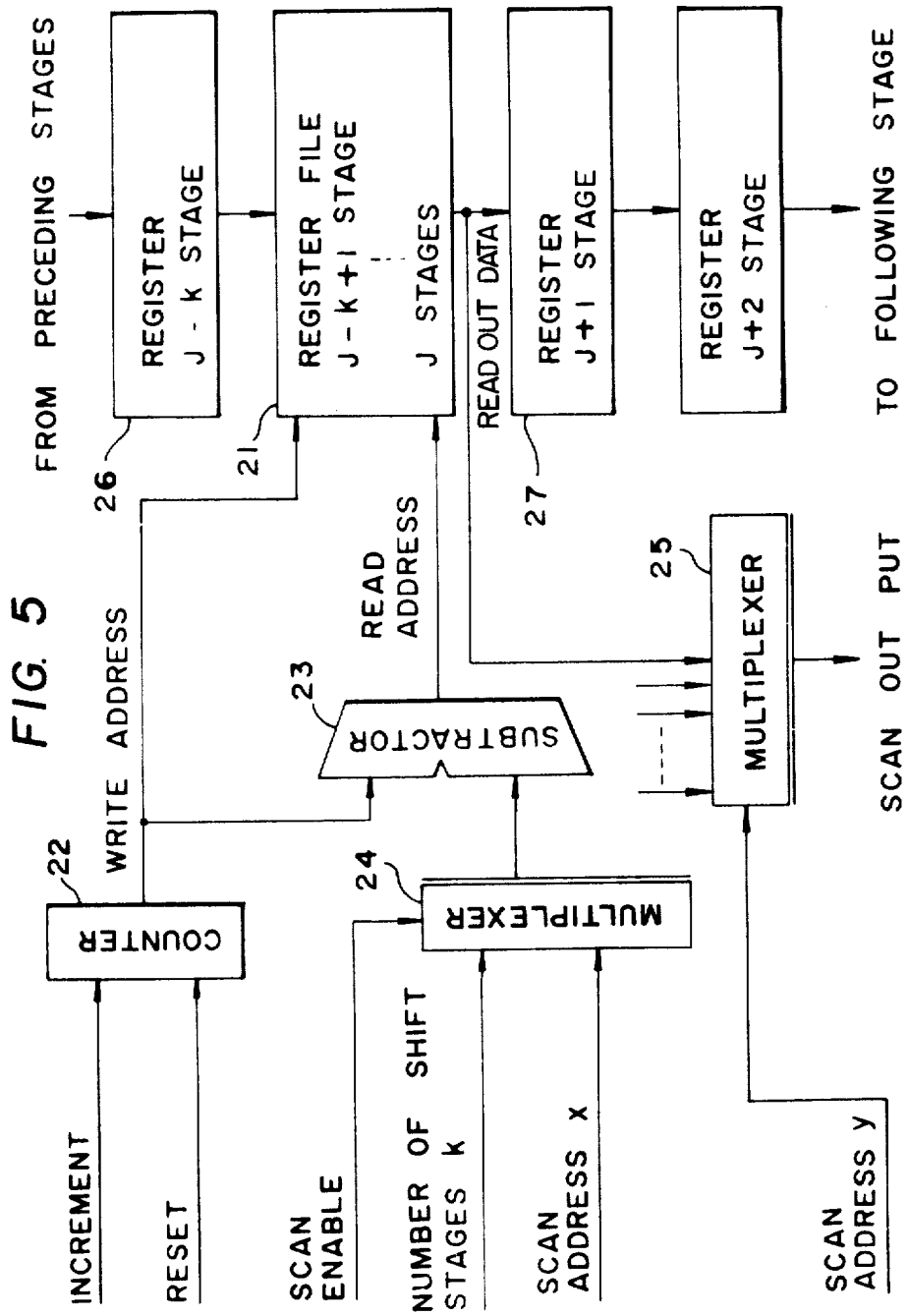

SCAN-OUT SYSTEM

BACKGROUND OF THE INVENTION

The present invention relates to a scan-out system having a simple circuit arrangement including a shift register formed by a memory or register file.

The fabrication of a circuit such as an LSI introduces difficulties in directly detecting the state of the LSI because the number of input/output pins is limited. The scan-out method is effective for directly detecting the state of the internal circuit through the limited number of input/output pins.

FIG. 1 shows the outline of a scan-out system. Reference numerals 1-0 to 1-2 indicate logical blocks; 2 designates a scan address register; 3-0 to 3-5 identify flip-flops; and 4-A and 4-B denote multiplexers. The flip-flops are respectively assigned addresses which are called scan addresses. The scan addresses are each set in the scan address register 2, the low-order address represents a scan address in the logical block and the high-order address identifies the logical block. In the illustrated example, the low-order address of the scan address is provided in common to the multiplexer 4-A and each logical block 1-0 to 1-2 and the status of one flip-flop in each logical block 1-0 to 1-2 is read out in parallel. Data read out from the logical blocks 1-0, 1-1 and 1-2 are input to the multiplexer 4-B. The high-order address in the scan address register 2 is applied to the multiplexer 4-B and, in accordance with the high-order address, the multiplexer 4-B selects and outputs one of the input data. The output of the multiplexer 4-B is provided, for instance, to a service processor. To output the status of a desired flip-flop or gate in an apparatus to the outside is called "scan-out".

Since a part formed by a memory element, such as a register file, calls for a memory readout operation, it cannot perform a scan-out operation given the circuit arrangement as illustrated. But a memory can be scanned out through utilization of an arrangement as shown in FIG. 2. In FIG. 2, reference numeral 5 indicates a register file (a memory); 6 designates a read address register; 7 identifies a write address register; 8 denotes a readout register; and 9 and 10 represent multiplexers. In FIG. 2 the multiplexer 9 is provided in a memory address input part. An address from a logical circuit for inputting and outputting data to the register file 5, and a scan address x (corresponding to the afoementioned low-order address) from a service processor or the like, is input to the multiplexer 9. When a scan enable signal is OFF, the multiplexer 9 is used as a readout address. Usually, while the system is in operation, the memory address is supplied from the logical circuit for inputting and outputting data to the register file 5, but, while the system is out of operation, the scan address is provided from the service processor or the like and the content of an address location identified by the scan address is output as read-out data. At this time, since the system is not in operation, data read out from the memory 5 is not input to the readout register 8. What is meant by "when the system is not in operation" is the period in which the system is in a stop-check state and a clock is stopped or a manual clock state and no clock is supplied. During scan-out, the data read out from the memory 5 is input to the multiplexer 10. Readout data from other circuit blocks are input to the multiplexer 10, though not shown, and the multiplexer 10 uses the scan address y input thereto as control information to select and output one of the input data.

FIG. 3 is a shift register formed by a register file. In FIG. 3, reference numeral 11 indicates a register file; 12 designates a counter; 13 identifies a subtractor; 14 and 15 denote multiplexers; 16 represents a preceding-stage register; and 17 is a following-stage register. The register file in one that is capable of concurrent execution of both write and read operations during the same cycle. The counter 12 designates a write address for the register file 11 and the subtractor 13 subtracts an arbitrary number k from the value of the counter 12 to produce a read address. Since the shift register permits the construction of a shift register having a desired number of stages with the same circuit arrangement, it is often employed as a control shift register for a pipeline or the like.

Now, a description will be given of forming five stages of shift registers by the register file 11 having eight registers as shown in FIG. 3. When the value of the counter 12 is "5", the write address of the register file 11 indicates the register having an address 5, but the read address indicates the register having an address 0 because of the subtractor 13. By the shift operation, the content of the register of the address 0 is read out at the same time as data is written into the shift register having the address 5 and, thereafter, the value of the counter 12 is incremented by one and the write address indicates a register having an address 6 and the read address indicates a register having an address 1. When the shift operation has been carried out five times by sequentially repeating the above-mentioned operations, the read address indicates a fifth address and the content of the register having the address 5 is read out after the shift operation has been effected five times. The values of the other registers are respectively read out after the shift operation takes place five times. In this way, there are shift registers having stages equal in number to the constant provided to the input of the subtractor.

For scanning out the content of the register file 11, the multiplexer 14 is provided in the read address input part of the register file 11, as in FIG. 2, by which the output of the subtractor 13 is normally selected as the read address and the scan address x is selected as the read address during the scan-out. The multiplexer 15 is controlled by the high-order address y.

A scan-out method as described above with respect to FIG. 2 is very convenient when the memory read addresses and the scan addresses have a one-to-one correspondence but, with regard to a shift register formed by the register file as shown in FIG. 3, the following point should be taken into account. FIG. 4 explains the scan-out of an ordinary shift register. Reference numerals 18-0 to 18-5 indicate flip-flops; and 19 designates a multiplexer. In the case where the shift register is formed by serial connection of the flip-flops 18-0 to 18-5 as shown in FIG. 4, scanning of (j-5)th to jth stages of the shift register can be performed using scan addresses applies to the flip-flops 18-0 to 18-5. For example, when the (j-5)th stage of the shift register is to be scanned, the flip-flop 18-0 is scanned and when the jth stage of the shift register is to be scanned, the flip-flop 18-5 is scanned. When the shift register comprises the register file as shown in FIG. 3, however, the positions of the stages of the shift register do not have a one-to-one correspondence with the numbers of the registers in the register file but bear a relative correspondence to the value of the counter. For instance when data is written into the fifth register and data is read out from the 0th register, the jth stage of the shift register is the 0th register and the (j-5)th stage corresponds to the fifth register. When the next shift operation takes place, the fifth register becomes the (j-4)th stage; namely, the correspondence differs from that in the immediately preceding cycle. In this way, the correspondence between the stages of the shift register and the numbers of the registers always differ, so that when a desired number of stages of the shift register is to be scanned, it is customary in the prior art to determine the numbers of the registers, noting the value of the counter which determines the write address of the register file. Such a system is inconvenient because the scan address becomes floating since the correspondence between the stages of the shift register and the numbers of the registers differ.

SUMMARY OF THE INVENTION

It is therefore an object of the present invention to provide a scan-out system by which data in a desired stage of a k-stage shift register composed of a memory, a counter for specifying a write address of the memory and a subtractor for subtracting an arbitrary value k from the value of the counter to specify a read address that can be scanned out without the necessity of knowing the value of the counter.

Briefly stated, the scan-out system of the present invention for use with a shift register comprises a memory, a counter for specifying a write address of the memory and an operator for subtracting an arbitrary value from the count value of the counter to specify a read address of the memory. A multiplexer is provided at the input side of the operator for calculating the read address of the memory. Either one of a constant for determining the number of shift stages and a scan address, which are input to the multiplexer, is selected in accordance with a scan enable signal which is also input to the multiplexer. Data selectively output from the multiplexer is then input to the input terminal of the operator.

BRIEF DESCRIPTION OF THE DRAWINGS

FIG. 4 is a diagram of a scan-out system for a shift register formed by a series connection of flip-flops; and FIG. 5 is a block diagram of an embodiment of a scan-out system according to the present invention.

DESCRIPTION OF THE PREFERRED EMBODIMENTS

Figure 1:
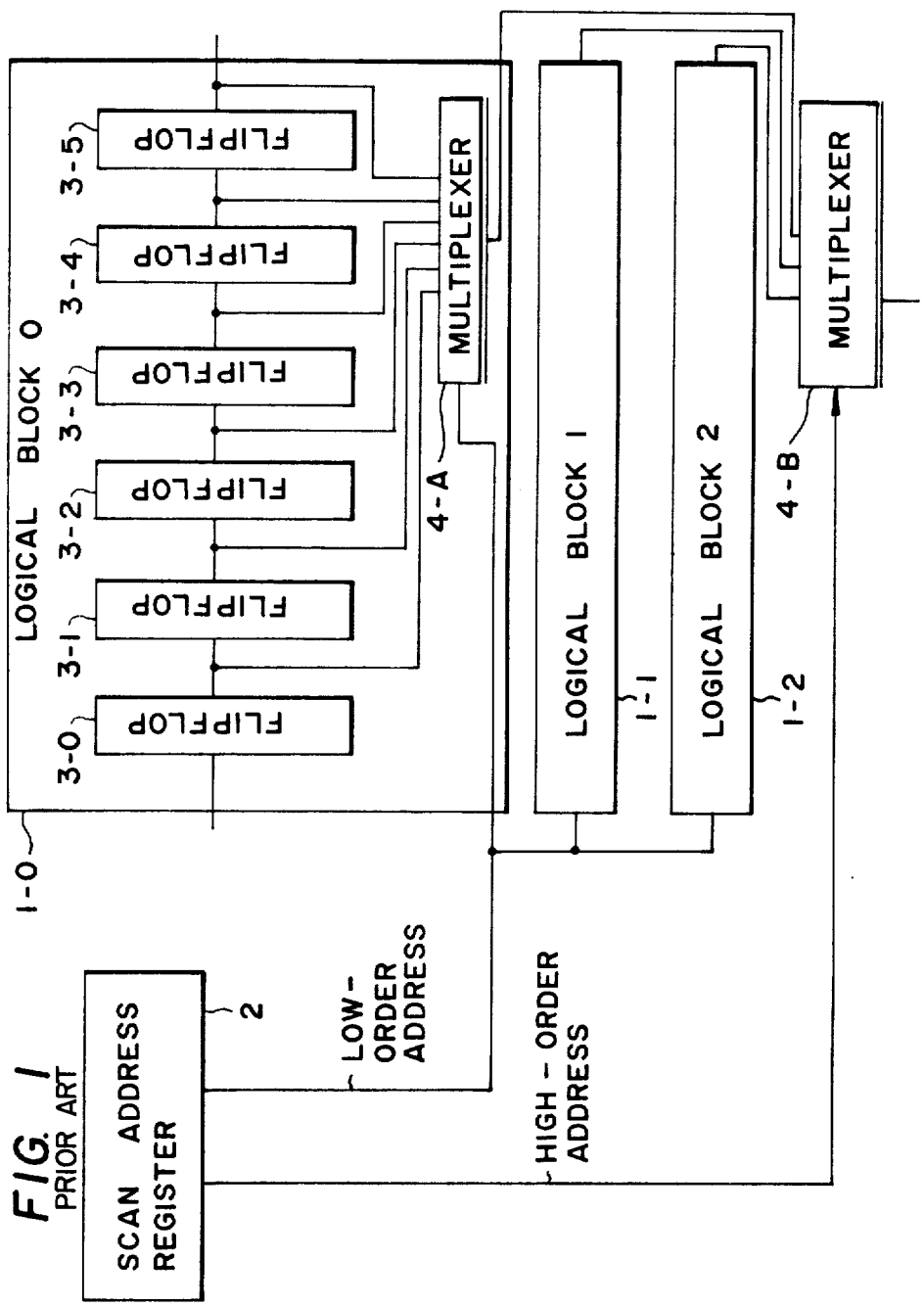
FIG. 1 is a circuir diagram of a prior art scan-out system.
Figure 2:
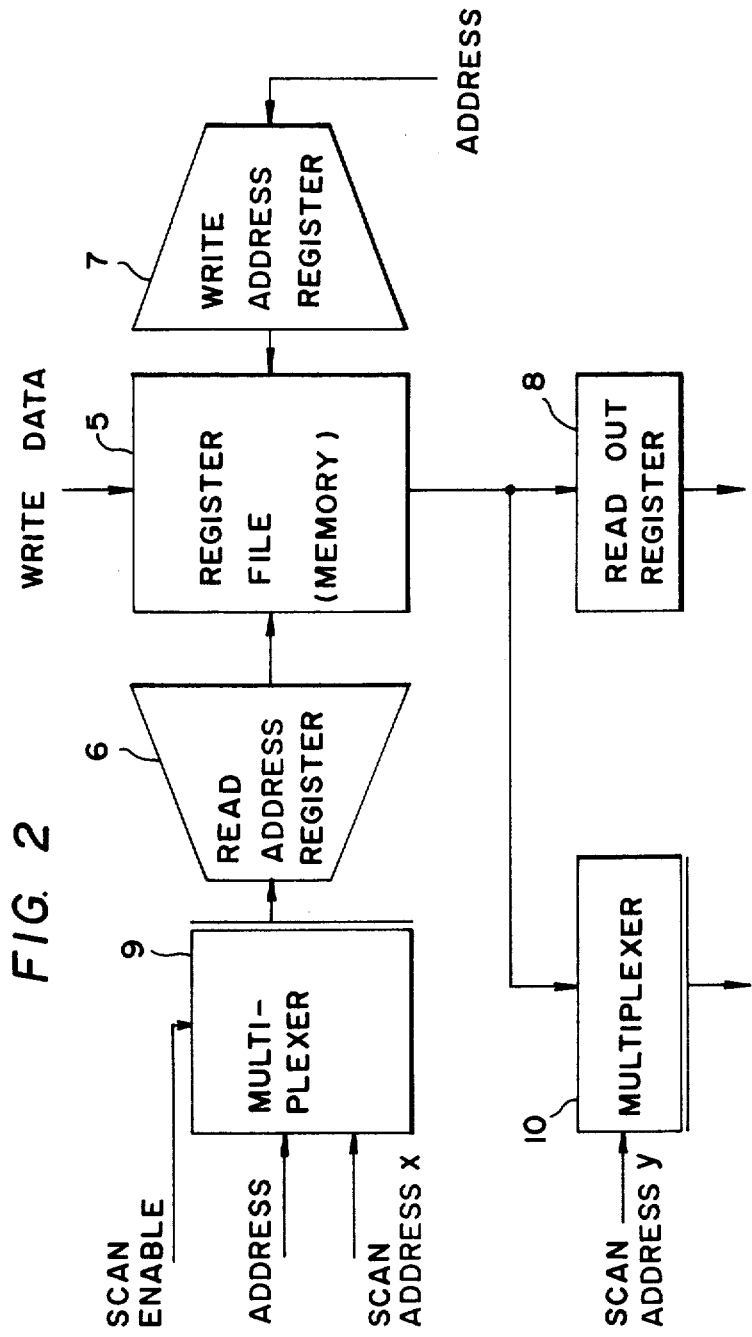
FIG. 2 is a block circuit diagram of a scan-out system for a memory or register file.
Figure 3:
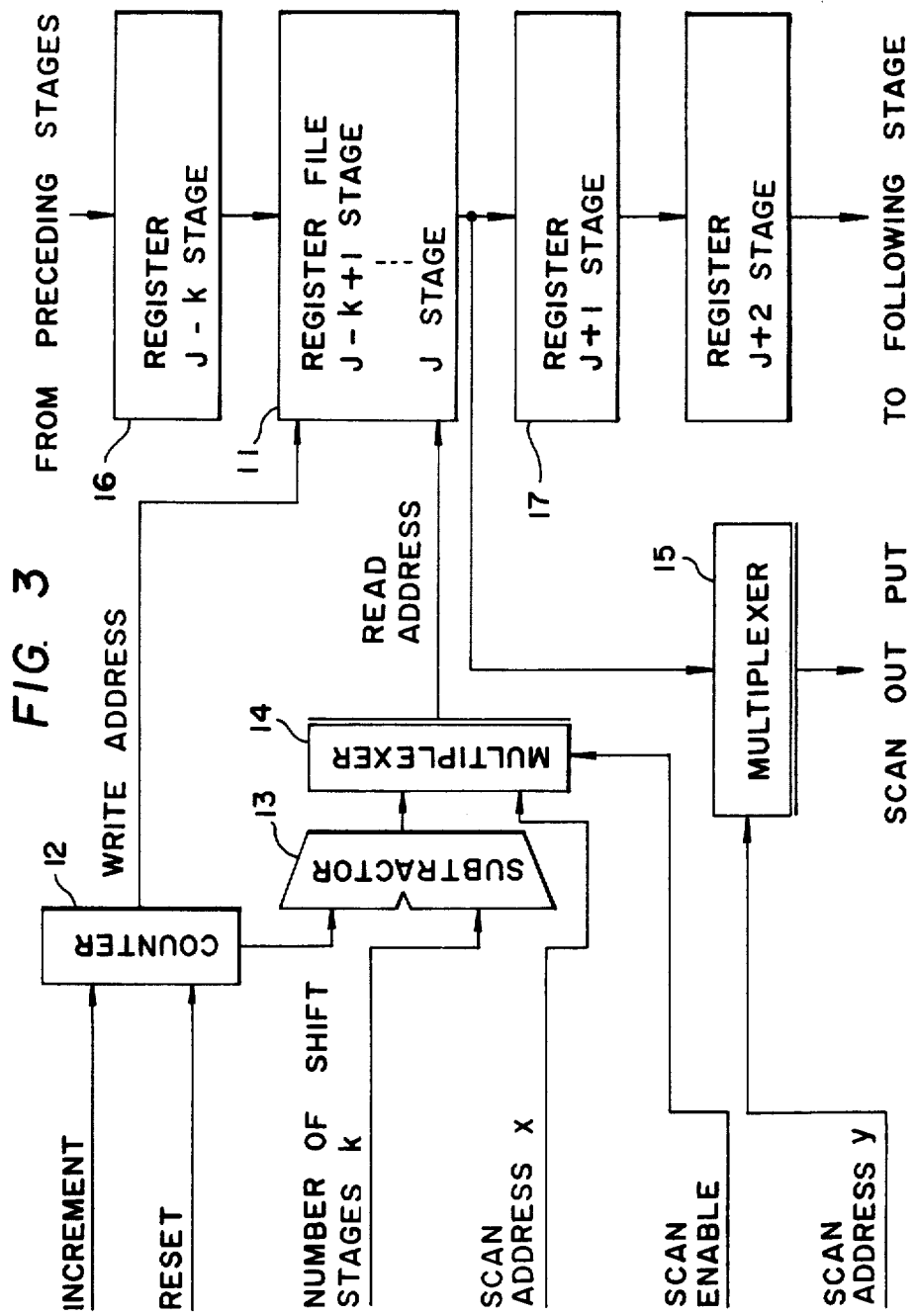
FIG. 3 is a block diagram of a scan-out system for a shift register formed by a register file.

A description will be given, with reference to FIG. 5, of the present invention.

FIG. 5 is an embodiment of the scan-out system of the present invention. In FIG. 5, reference numeral 21 indicates a register file; 22 designates a counter; 23 identifies a subtractor; 24 and 25 denotes multiplexers; 26 is a register for holding input data to be input to the register file 21; and 27 refers to a register for holding output data output from the register file 21. The register file 21 comprises a plurality of registers. The counter 22 is one that represents a write address to be supplied to the register file 21 and is capable of counting from 0 to $2^n - 1$, for instance. The register file 21 also addresses 0 to $2^n - 1$. The subtractor 23 substracts the value of the multiplexer 24 from the count value of the counter 22. Let it be assumed that numeric values are each represented by three bits. When the count value of the counter 22 is "2" and the output of the multiplexer 24 is "3", a subtraction of the latter from the former provides "−1" but, when the numeric values are represented by three bits, the subtractor 23 outputs a numeric value "6". The output of the subtractor 23 is used as the read address. A number of shift stages k, a scan address x as data and a scan enable signal as control information, are input to the multiplexer 24. The multiplexer 24 outputs the number of shift stages k or the scan address x depending on whether the scan enable signal is OFF or ON. The multiplexer 25 is supplied, during the scan-out, with data read out from the register file 21 and data from other circuit blocks or register files. The multiplexer 25 selects and outputs one of the plurality of input data in accordance with a scan address y.

This embodiment usually operates as follows. Let it be assumed that the number of shift stages is "5", and that the count value of the counter 22 is also "5". In this case, data is written into a fifth register of the register file 21 and data is read out from a zeroth register. The jth to (j-5)th stages of the shift register in FIG. 4 correspond to the zero to fifth registers in FIG. 5, respectively.

During the scan-out operation the multiplexer 24 inputs the scan address x, in place of the number of shift stages k, to the subtractor 23. The jth stage is scanned when the value of the counter 22 is "5", and the data in the zero register is read out. Accordingly, since the value of the counter 22 indicates "5", the scan address x must be "5"; that is, when the (j-1)th to (j-5)th stages are to be scanned, the scan address x takes the values of "4", "3", "2", "1" and "0", respectively.

When the shift operation is carried out, the value of the counter 22 becomes "6" and the read address becomes "1". At this time, the jth to (j-5)th stages become the first to sixth registers of the register file 21, respectively.

When performing the above-mentioned scan-out operation in this state, the content of the first register of the register file 21 is scanned out because when the scan address x is "5", the counter 22 indicates "6" and the read address is "1". In this case, the first register corresponds to the jth stage of the shift register. Similarly, when the scan address x is "4", data of the second register is scanned out. In a likewise manner, as the scan address sequentially to "3", "2", "1" and "0", data of the third, fourth, fifth and sixth registers are scanned out. When the value of the counter 21 is "6", the third, fourther, fifth and sixth registers respectively correspond to the (j-2)th, (j-3)th, (j-4)th and (j-5)th stages.

As described above, according to the present invention, since the scan address is modified by the value of the counter, a desired stage of the shift register can be scanned out without the necessity of learning the value of the counter.

While in the foregoing, the subtractor is used for modifying the read address of the register file, it is needless to say that, in the case of employing an adder, a complement of the number of stages of the register file is input as the modification constant.

It will be apparent that many modifications and variations may be effected without departing from the scope of the novel concepts of the present invention.

What is claimed is:

1. A scan-out, system, operatively connected to receive a constant, a scan address and a scan enable signal, for a shift register formed by a memory, comprisng:
   a counter for designating a write address of the memory;
   an operator, operatively connected to said counter and having an input terminal side, for determining an arbitrary value from the count value of said counter to designate a read address of the memory and operatively connected to receive the constant for determining the number of shift stages of the shift register, the scan address and the scan enable signal;
   a multiplexer, operatively connected at the input terminal side of said operator and operatively connected to receive the constant for determining the number of shift stages of the shift register, the scan address and the scan enable signal, for calculating the read address of the memory, one of the constant for determining the number of shift stages of the shift register and the scan address being selected in accordance with the scan enable signal to selectively ouput data from said multiplexer to the input terminal side of said operator.

2. A scan-out system according to claim 1, wherein said operator is a subtractor for subtacting the constant from the count value of said counter.

3. A scan-out system according to claim 1, wherein said operator is an adder for adding a complement of the constant to the count value of said counter.

4. A scan-out system for a shift register of a memory having read and write addresses and operatively connected to receive first and second scan addresses, a scan enable signal and a constant, comprising:
   a counter, operatively connected to said memory, for generating a count value for designating the write address of the memory;
   an operator having an input terminal side, operatively connected to said counter, for determining a value based on the count value of said counter to designate one of the read addresses of the memory;
   a first multiplexer, operatively connected to said operator and operatively connected to receive the first scan address, the scan enable signal and the constant, for selecting one of the first scan address and the constant in accordance with the scan enable signal, for calculating said one of the read addresses of the memory, and for selectively outputting said one of the read addresses to said operator; and
   a second multiplexer, operatively connected to receive the second scan address, for outputting data in accordance with the second scan address.

5. A scan-out system according to claim 4, wherein said operator is a subtractor for subtracting the constant from the count value of said counter.

6. A scan-out system according to claim 4, wherein the operator is an adder for adding a compliment of the constant to the count value of said counter.

* * * * *

UNITED STATES PATENT AND TRADEMARK OFFICE
CERTIFICATE OF CORRECTION

PATENT NO. : 4,491,935
DATED : JANUARY 1, 1985
INVENTOR(S) : HIDEKIYO OZAWA ET AL.

It is certified that error appears in the above-identified patent and that said Letters Patent is hereby corrected as shown below:

Col. 1, line 7, after "arrangement" insert --which permits scanning out,--;
       line 49, "afoe-" should be --afore- --;
       line 69, "10uses" should be --10 uses--.

Col. 3, line 44, "circui" should be --circuit--.

Col. 4, line 25, "zeroth" should be --zero--;
       line 54, "fourther" should be --fourth--.

Col. 5, line 3, "scan-out," should be --scan-out--;
       line 5, "comprisng" should be --comprising--.

Signed and Sealed this

Fourth Day of June 1985

[SEAL]

Attest:

DONALD J. QUIGG

*Attesting Officer*     *Acting Commissioner of Patents and Trademarks*